United States Patent
Leroux

(10) Patent No.: US 9,915,518 B2
(45) Date of Patent: Mar. 13, 2018

(54) CLEARANCE MEASURING SENSOR WITH ABRADABLE ELECTRODE

(71) Applicant: SNECMA, Paris (FR)

(72) Inventor: Andre Leroux, Samois sur Seine (FR)

(73) Assignee: SNECMA, Paris (FR)

( * ) Notice: Subject to any disclaimer, the term of this patent is extended or adjusted under 35 U.S.C. 154(b) by 465 days.

(21) Appl. No.: 14/290,071

(22) Filed: May 29, 2014

(65) Prior Publication Data

US 2014/0356166 A1    Dec. 4, 2014

(30) Foreign Application Priority Data

May 30, 2013 (FR) ..................................... 13 54948

(51) Int. Cl.
| | |
|---|---|
| *G01B 7/14* | (2006.01) |
| *G01B 7/06* | (2006.01) |
| *F04C 28/28* | (2006.01) |
| *G01R 27/26* | (2006.01) |

(52) U.S. Cl.
CPC .............. *G01B 7/14* (2013.01); *F04C 28/28* (2013.01); *G01B 7/08* (2013.01); *G01R 27/2605* (2013.01)

(58) Field of Classification Search
CPC ...... F01D 11/122; F01D 17/20; F04D 29/526; G01B 7/08; G01B 7/14; G01R 27/2605; F04C 28/08
See application file for complete search history.

(56) References Cited

U.S. PATENT DOCUMENTS

| | | | | |
|---|---|---|---|---|
| 4,823,071 A | * | 4/1989 | Ding | .................. G01B 7/14 324/611 |
| 5,818,242 A | * | 10/1998 | Grzybowski | ......... F01D 11/025 324/642 |
| 5,975,845 A | * | 11/1999 | Ball | ................. F01D 11/02 415/173.4 |
| 6,208,128 B1 | | 3/2001 | Braconnier et al. | |
| 7,688,081 B2 | * | 3/2010 | Webster | .................. F01D 11/22 324/662 |
| 8,560,266 B2 | * | 10/2013 | Zielinski | .................. F01D 11/20 702/158 |

FOREIGN PATENT DOCUMENTS

| | | |
|---|---|---|
| BE | 893 660 | 10/1982 |
| DE | 38 15 208 | 12/1988 |
| GB | 2 449 708 | 12/2008 |

OTHER PUBLICATIONS

Search Report and Written Opinion issued for French Patent Application No. 1354948, dated Oct. 7, 2013.

* cited by examiner

*Primary Examiner* — Logan Kraft
*Assistant Examiner* — Peter T Hrubiec
(74) *Attorney, Agent, or Firm* — Pillsbury Winthrop Shaw Pittman LLP

(57) ABSTRACT

A capacitive sensor for measuring the clearance between the apex of the vanes of a rotor and the inner surface of an abradable coating covering the inner surface of a turbomachine casing, the clearance measuring capacitive sensor including a first electrode the material of which is abradable so as to get worn upon contacting an apex of a vane, the material of the first electrode having a degree of wear substantially identical to the degree of wear of the material of the abradable coating.

10 Claims, 2 Drawing Sheets

CLEARANCE MEASURING SENSOR WITH ABRADABLE ELECTRODE

CROSS-REFERENCE TO RELATED APPLICATIONS

The present application claims priority and benefit to French Patent Application No. 1354948, filed May 30, 2013, the content of which is incorporated herein in its entirety by reference.

TECHNICAL FIELD

The present invention relates to a clearance measuring sensor with an abradable electrode. It is more particularly concerned with a sensor for measuring the clearance between the apex of the vanes of a rotor and the inner surface of an abradable coating covering the inner surface of a turbomachine casing.

STATE OF PRIOR ART

Conventionally, a bypass turbomachine comprises from upstream to downstream a fan at the outlet of which an airflow is divided on the one hand into a primary airflow flowing inside a turbojet engine in a compressor, a combustion chamber and then a turbine, and on the other hand into a secondary airflow flowing about the turbojet engine.

The fan includes a rotor including at its outer periphery a plurality of evenly distributed rotor vanes, the vanes being externally surrounded by an outer casing. To avoid an air passage at the apex of the vanes which would decrease the turbomachine yield, a coating of abradable material is carried by the inner surface of the fan outer casing and provided flush with the fan vanes.

In operation, it is important to know and control the clearance between the radially outer ends of the vanes and the casing in order to permanently keep a minimum but sufficient distance between the free ends of the vanes and the casing to avoid any contact that could be detrimental to the mechanical strength, and consequently to the life time, of the rotor provided with the vanes.

Within the framework of measurements of clearances at the apex of rotor vanes, a measuring method is to use capacitive sensors. In such an implementation, each sensor includes a first metal electrode positioned on the outer casing, the first electrode making up one of the electrodes making a capacitor. The second electrode is formed on each vane apex. When a vane comes with the first electrode, the distance is minimum and thus the capacitance is maximum. The measurement of this capacitance gives an image of the measurement of the distance between the first electrode and the vane apex.

As set out previously, the outer casing which is made of metal is covered with a coating softer than the metal (abradable coating) which allows a penetration of the vane apex through abrasion of the surface of the abradable coating without resulting in excess mechanical stresses in the vane. In order to avoid any contact, and thus any damage, between the first electrode and the vane apex, the first electrode is positioned recessed from the inner surface of the abradable coating, at a depth higher than an expected as a penetration of the vane into the abradable coating.

The distance measured being the distance separating the vane apex from the first electrode, the value of the recess of the first electrode from the inner surface of the abradable coating should be subtracted to obtain the distance separating the vane apex from the inner surface of the abradable coating.

In case of penetration of the vane into the abradable coating, the inner surface of the coating goes backwards and thus the clearance between the abradable coating and the vane apex increases without being measured by the sensor.

In cases where strong penetrations of the vane into the abradable coating are foreseen, the first electrode is positioned recessed such that the measurement is substantially unreachable when the clearances are strongly open (as is often the case in idle state). The measurement is thus strongly noisy and/or impractical.

When the signal from the capacitive sensor is used to make measurements according to the so-called tip-timing technology, this technique imposes to have signals with a rise time as brief as possible and thus to use an electrode as small as possible and as close as possible to the vane apex. The security recess imposed to the first electrode is in opposition to this need.

DISCLOSURE OF THE INVENTION

One purpose of the invention is to overcome the drawbacks of the state of the art. In this context, one object of the present invention is to provide a sensor for measuring the clearance between the apex of the vanes of a rotor and the inner surface of an abradable coating covering the inner surface of a turbomachine casing having an increased measuring accuracy.

To that end, the invention relates to a capacitive sensor for measuring the clearance between the apex of the vanes of a rotor and the inner surface of an abradable coating covering the inner surface of a turbomachine casing. The clearance measuring capacitive sensor particularly includes a first electrode the material of which is abradable so as to get worn upon contacting the vane apex, said material of said first electrode having a degree of wear substantially identical (or even identical) to the degree of wear of the material of said abradable coating.

In other words, the material of the first electrode is selected so as to get worn, upon contacting a vane apex, substantially identically (or identically) to the abradable coating covering the inner surface of the casing. Thus, upon contacting a vane apex, the first electrode and the abradable coating get worn on a substantially identical (or identical) depth. The clearance between the vane apex and the abradable coating (also formed by the distance between the vane apex and the first electrode) is thus measured with a great accuracy and continuously.

The clearance measuring capacitive sensor according to the invention can also have one or more of the characteristics herein below, considered singly or according to any technically feasible combinations.

In a non limiting embodiment, the surface of the first electrode for contacting a vane apex is positioned in alignment with the inner surface of the abradable coating.

Thus, the surface of the first electrode of the sensor for contacting the vanes is aligned with the abradable coating covering the outer casing. Thus, no recess between the sensor head (formed by the first electrode) with respect to the surface of the abradable coating is present. With such a zero recess the distance measured exactly corresponds to the distance separating the apex of the vanes from the inner surface of the abradable coating covering the casing. The clearance measurement is thus an exact and accurate measurement. Such a clearance measurement is further continuous.

In a non limiting embodiment, the material of the first electrode is graphite.

In a non limiting embodiment, the material of the abradable coating covering the inner surface of the casing is a conducting material and the material of the first electrode is identical to that of the abradable coating.

In a non limiting embodiment, the clearance measuring sensor has an electrically insulating peripheral zone separating the first electrode from the abradable coating covering the inner surface of the casing.

In a non limiting embodiment, the material of the electrically insulating peripheral zone is selected so as to get worn upon contacting the vane apex.

In a non limiting embodiment, the material of the electrically insulating peripheral zone has a degree of wear substantially identical (or even identical) to the degree of wear of the material of the abradable coating.

In a non limiting embodiment, the wear thickness of the first electrode is between 1 mm and 15 mm. This wear thickness is for example on the order of 10 mm for a fan and on the order of 2 mm for a compressor stage.

In a non limiting embodiment, the first electrode is circular and has a diameter between 1 mm and 15 mm. This diameter is for example on the order of 10 mm for a fan and on the order of 3 mm for a compressor stage.

The invention also relates to a turbomachine fan or compressor or turbine including a capacitive sensor for measuring the clearance between the apex of the vanes of a rotor and an inner surface of an abradable coating covering the inner surface of a turbomachine casing. The clearance measuring capacitive sensor according to the invention includes a first electrode the material of which is abradable so as to get worn upon contacting the vane apex, said material of said first electrode having a degree of wear substantially identical (or even identical) to the wear extent of the material of the abradable coating.

BRIEF DESCRIPTION OF THE FIGURES

Further characteristics and advantages of the invention will become more apparent from the description thereof given herein below, by way of indication and in no limiting purposes, in reference to the appended figures, wherein.

For the sake of clarity, only the useful elements for understanding the invention have been represented not necessarily at a uniform scale and schematically. Further, similar elements on different figures bear identical references.

DETAILED DESCRIPTION OF AT LEAST ONE EMBODIMENT OF THE INVENTION

The description that follows is applicable to a turbomachine fan. However, it is applicable to other rotating parts of the turbomachine such as the compressor and turbine.

Figure 1:
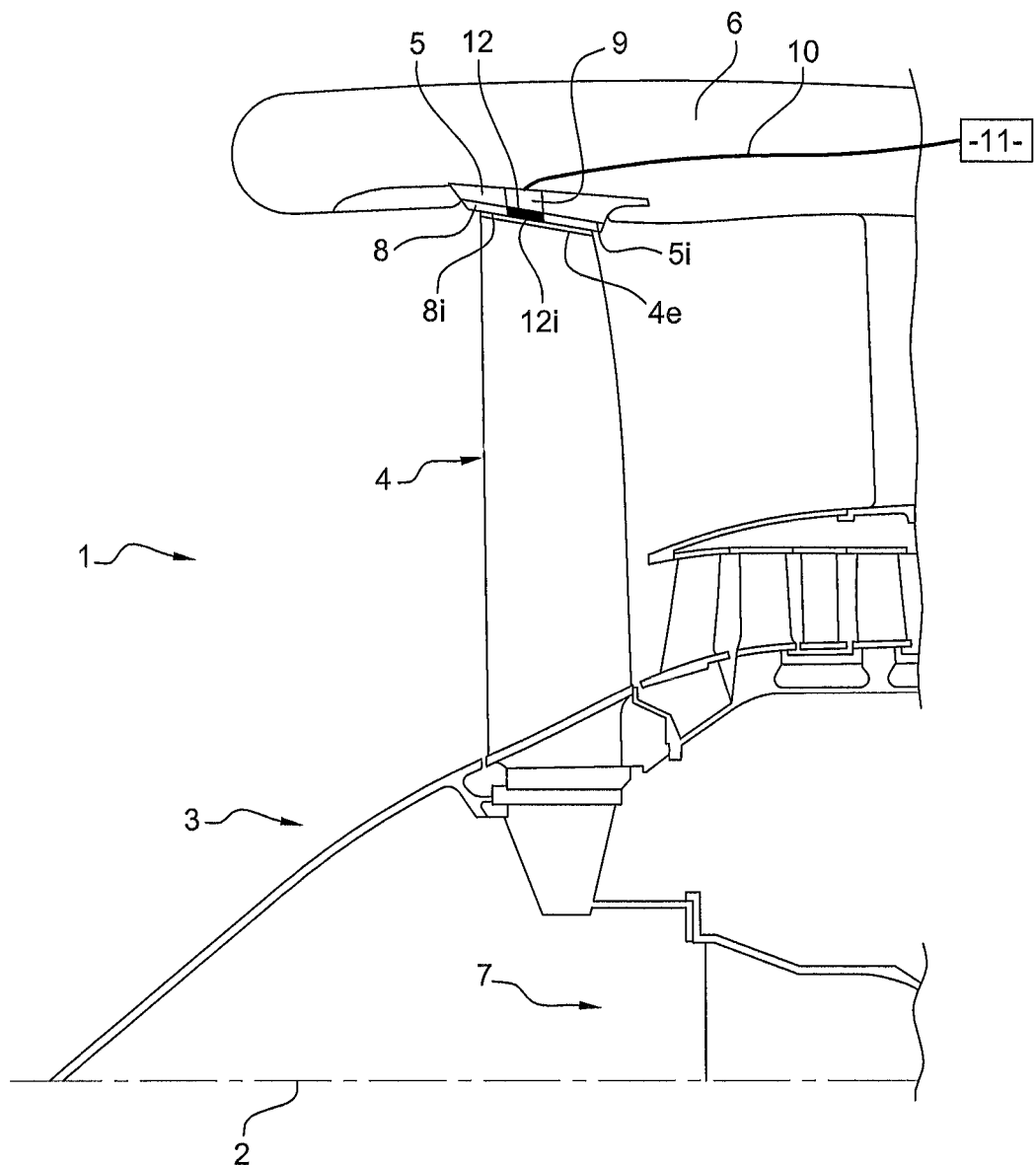
FIG. 1 illustrates a non limiting exemplary embodiment of a turbomachine fan according to the invention shown in an axial cross section view.

FIG. 1 illustrates a schematic axial cross section half view of a fan 1 according to the invention of a turbomachine with a longitudinal axis 2, including a rotor 3 carrying at its periphery a plurality of vanes 4 (only one is represented in FIG. 1). Each vane 4 has a root integral with the rotor 3 and extends radially outwardly to a fan casing 5 carrying a nacelle 6 externally surrounding the vanes 4. The rotor 3 is rotatably driven about the axis 2 of the turbomachine by a shaft 7 integral with the rotor 3.

The fan casing 5 comprises an inner face 5i. An abradable coating 8 covers the inner face 5i of the casing 5 and is provided flush with the fan vanes 4. This abradable coating 8 is for getting worn upon contacting the radially outer ends 4e of the vanes 4. This layer of abradable material 8 enables the clearances between the apexes of the vanes 4e and the fan casing 5 to be reduced, and thus the turbomachine performance to be optimized.

In order to measure the clearances at the apexes of the vanes 4 of the fan 1, there are a plurality of capacitive sensors 9 (a single sensor is represented) which are evenly distributed at the periphery of the casing 5. Each sensor 9 is connected by a cable 10 to a data processing unit 11.

Each sensor 9 has a first electrode 12 having a surface 12i aligned with the inner surface 8i of the abradable coating 8.

The material of the first electrode 12 is selected so as to get worn upon contacting the radially outer ends 4e of the vanes 4. In other words, the material of the first electrode 12 is abradable such that when contacted with the vanes rotating about a longitudinal axis 2 of the turbomachine, the first electrode 12 gets preferentially worn at the ends 4e of the vanes 4.

It should be noted that the material of the first electrode 12 has a degree of wear extent substantially identical (or even identical) to the degree of wear of the material of the abradable coating 8. Thus, the first electrode 12 and the abradable coating 8 get worn upon contacting an apex 4e of a vane 4, substantially identically (or identically). Thus, the distance between the apex 4e of the vane 4 and the first electrode 12 corresponds exactly to the distance between the vane apex 4e and the inner surface 8i of the abradable coating 8. The clearance measurement is thus very accurate and continuous.

Further, the material of the first electrode 12 should be selected so as to not induce mechanical stresses on the vanes 4 when their ends 4e rub against the first electrode 12.

The material of the first electrode 12 has further to have characteristics enabling it to get gradually worn without rupturing or breaking away as a bloc.

Besides, the material of the first electrode 12 must enable to ensure an electrical connexion with the cable 10 connected to the data processing unit 11.

In a non limiting embodiment, the material of the first electrode 12 is graphite. Graphite enables mechanical stresses not to be induced on the vane when the end 4e of the vane 4 rubs against the first electrode 12, it gets further gradually worn without rupturing and is able to ensure an electrical connexion with the cable 10 connected to the data processing unit 11. Needless to say that this choice of material is not limiting, and every other material having such mechanical and electrical characteristics can be used to make the first electrode 12.

The second electrode of the sensor 9 is formed by the ends 4e of the fan vanes 4. When a vane 4 comes flush with the first electrode 12, the distance is minimum and thus the capacitance is maximum. The measurement of this capacitance gives an image of the measurement of the distance between the first electrode 12 and the vane apex 4e.

By virtue of the invention, no recess between the head of the capacitive sensor (formed by the first electrode 12) with respect to the surface of the abradable coating 8 is present. With such a null recess, the distance measured corresponds exactly to the distance separating the apex of the vanes 4e from the inner surface 8i of the abradable coating 8 covering the casing 5. The clearance measurement is thus an accurate and precise measurement.

Further, in cases where the vane 4 penetrates the abradable coating 8 and simultaneously the first electrode 12, the abradable coating 8 and electrode 12 get similarly worn. As a result, the clearance measured remains advantageously the distance separating the inner surface 8i from the abradable coating 8 and the vane apex 4e.

Figure 2:
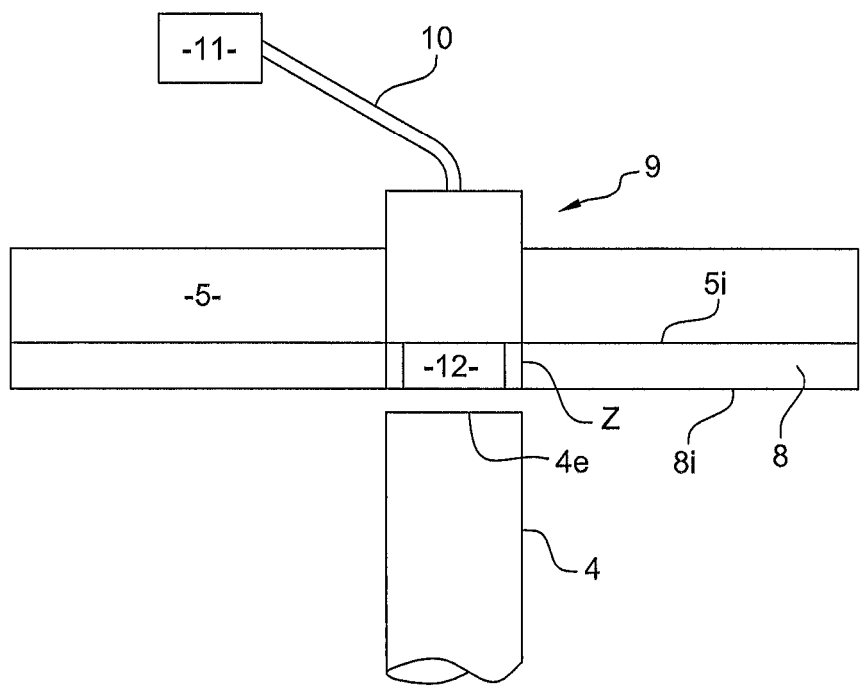
FIG. 2 illustrates schematically a non limiting exemplary embodiment of a capacitive sensor for measuring the clearance between the apex of the vanes of a rotor and the inner surface of an abradable coating covering the inner surface of a turbomachine casing.

FIG. 2 schematically illustrates a non limiting exemplary embodiment of a capacitive sensor 9 for measuring the clearance between the apex 4e of the vanes 4 (only the end is illustrated) of a rotor and the inner surface 8i of an abradable coating 8 covering the inner surface 5i of a turbomachine casing 5.

According to this embodiment, the material of the abradable coating 8 covering the inner surface 5i of the casing 5 is conducting. This material is for example formed by Metco601.

According to this embodiment, the material of the first electrode 12 is identical to that of the abradable coating 8, in other words Metco601. Metco601, as graphite, enables the chemical stresses not to be induced on the vane 4 when rubbing against the first electrode 12, it gets further gradually worn without rupturing and is able to ensure an electrical connection with the cable 10 connecting to the data processing unit 11.

Figure 3:
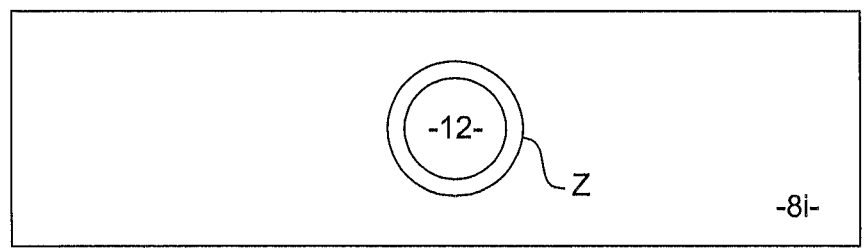
FIG. 3 illustrates a top view of the clearance measuring capacitive sensor illustrated in FIG. 2.

According to the implementation illustrated in FIG. 3 (case of a sensor mounted to a compressor casing), the first electrode 12 is round-shaped in a non-limiting way, and has in a non limiting implementation a diameter in the order of 3 mm and a backup wear thickness in the order of 2 mm.

In such an implementation, in order to be able to carry out the clearance measurement optimally, an electrically insulating periphery zone Z is provided between the first electrode 12 and the abradable coating 8 covering the inner surface 5i of the casing 5. This electrically insulating periphery zone Z is itself of abradable material so as to get preferentially worn at the ends 4e of the vanes 4 when these ends 4e rub against (or contact) this electrically insulating peripheral zone Z.

Throughout the description, a single sensor has been represented for the seek of clarity. Of course, the fan can have 2, 3, 4 or any other amount of capacitive sensors according to the invention without departing from the scope of the invention, wherein these capacitive sensors are evenly distributed at the circumference of the fan casing 6 and provided flush with the ends of the vanes 4.

It should also be noted that what has been described in reference to a turbomachine fan is also applicable to any other part of a turbomachine enabling a clearance measurement capacitive sensor to be mounted between the apex of the vanes of a rotor and the inner surface of an abradable coating as previously described. In particular, the capacitive sensor according to the invention is applicable to a compressor or turbine, in particular a low pressure turbine. In the case of a turbine, the abradable coating is for example a metal honeycomb material.

The invention claimed is:

1. A capacitive sensor for measuring a clearance between an apex of vanes of a rotor and an inner surface of an abradable coating covering an inner surface of a turbomachine casing, said clearance measuring capacitive sensor comprising:
a first electrode made of a material which is abradable so as to get worn upon contacting the apex of a vane, said material of said first electrode having a degree of wear substantially identical to a degree of wear of a material of said abradable coating, the material of the abradable coating covering the inner surface of the casing being conducting and the material of the first electrode being identical to that of the abradable coating, and
an electrically insulating peripheral zone separating the first electrode from the abradable coating covering the inner surface of the casing, said electrically insulating peripheral zone made of an abradable material and having a length, along a direction perpendicular to said inner surface of the turbomachine casing, that is equal to a thickness of the abradable coating.

2. The clearance measuring capacitive sensor according to claim 1, wherein the surface of the first electrode for contacting a vane apex is positioned aligned with the inner surface of the abradable coating.

3. The clearance measuring capacitive sensor according to claim 1, wherein the material of the first electrode is graphite.

4. The clearance measuring capacitive sensor according to claim 1, wherein the material of the electrically insulating peripheral zone is selected so as to get worn upon contacting the apex of the vane.

5. The clearance measuring capacitive sensor according to claim 4, wherein the material of the electrically insulating peripheral zone has a degree of wear substantially identical to the degree of wear of the material of the abradable coating.

6. The clearance measuring capacitive sensor according to claim 1, wherein a wear thickness of the first electrode is between 1 mm and 15 mm.

7. The clearance measuring capacitive sensor according to claim 1, wherein the first electrode is circular and has a diameter between 1 mm and 15 mm.

8. A turbomachine fan or compressor or turbine including a capacitive sensor for measuring the clearance between an apex of vanes of a rotor and an inner surface of an abradable coating covering an inner surface of a turbomachine casing, wherein said clearance measuring capacitive sensor includes
a first electrode made of a material which is abradable so as to get worn upon contacting the apex of the vane, said material of said first electrode having a degree of wear substantially identical to a degree of wear of a material of said abradable coating, the material of the abradable coating covering the inner surface of the casing being conducting and the material of the first electrode being identical to that of the abradable coating, and
an electrically insulating peripheral zone separating the first electrode from the abradable coating covering the inner surface of the casing, said electrically insulating peripheral zone made of an abradable material and having a length, along a direction perpendicular to said inner surface of the turbomachine casing, that is equal to a thickness of the abradable coating.

9. The clearance measuring capacitive sensor according to claim 1, wherein the electrically insulating peripheral zone surrounds the first electrode so as to isolate the first electrode from the abradable coating covering the inner surface of the casing.

10. The turbomachine fan or compressor or turbine according to claim 8, wherein the electrically insulating peripheral zone surrounds the first electrode so as to isolate the first electrode from the abradable coating covering the inner surface of the casing.

\* \* \* \* \*